US010453934B1

(12) United States Patent
Basker et al.

(10) Patent No.: US 10,453,934 B1
(45) Date of Patent: Oct. 22, 2019

(54) VERTICAL TRANSPORT FET DEVICES HAVING AIR GAP TOP SPACER

(71) Applicant: International Business Machines Corporation, Armonk, NY (US)

(72) Inventors: Veeraraghavan S. Basker, Schenectady, NY (US); Kangguo Cheng, Schenectady, NY (US); Theodorus E. Standaert, Clifton Park, NY (US); Junli Wang, Slingerlands, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/004,816

(22) Filed: Jun. 11, 2018

(51) Int. Cl.
| | |
|---|---|
| *H01L 29/49* | (2006.01) |
| *H01L 29/78* | (2006.01) |
| *H01L 29/08* | (2006.01) |
| *H01L 29/66* | (2006.01) |
| *H01L 21/28* | (2006.01) |
| *H01L 21/764* | (2006.01) |

(52) U.S. Cl.
CPC .... *H01L 29/4991* (2013.01); *H01L 21/28088* (2013.01); *H01L 21/764* (2013.01); *H01L 29/0847* (2013.01); *H01L 29/4966* (2013.01); *H01L 29/66553* (2013.01); *H01L 29/66666* (2013.01); *H01L 29/7827* (2013.01)

(58) Field of Classification Search
CPC ............................................... H01L 21/28088
See application file for complete search history.

(56) References Cited

U.S. PATENT DOCUMENTS

| | | | |
|---|---|---|---|
| 5,914,519 A | 6/1999 | Chou et al. | |
| 8,421,166 B2 * | 4/2013 | Chi | H01L 29/665 257/202 |
| 8,999,837 B2 * | 4/2015 | Park | H01L 21/76814 438/619 |
| 9,112,052 B2 * | 8/2015 | Chen | H01L 21/823481 |
| 9,299,835 B1 | 3/2016 | Anderson et al. | |
| 9,368,572 B1 * | 6/2016 | Cheng | H01L 29/7827 |
| 9,443,982 B1 | 9/2016 | Balakrishnan et al. | |
| 9,570,357 B2 | 2/2017 | Anderson et al. | |
| 9,691,850 B2 | 6/2017 | Cheng et al. | |
| 9,721,897 B1 * | 8/2017 | Cheng | H01L 23/535 |
| 9,735,246 B1 * | 8/2017 | Basker | H01L 29/42392 |
| 9,741,716 B1 | 8/2017 | Cheng et al. | |
| 9,748,380 B1 | 8/2017 | Lie et al. | |
| 9,786,760 B1 * | 10/2017 | Bonilla | H01L 29/4991 |
| 9,812,567 B1 * | 11/2017 | Basker | H01L 29/7827 |
| 9,853,028 B1 | 12/2017 | Cheng et al. | |
| 9,859,166 B1 | 1/2018 | Cheng et al. | |
| 10,014,391 B2 * | 7/2018 | Bergendahl | H01L 29/785 |
| 10,134,866 B2 * | 11/2018 | Cheng | H01L 29/4991 |
| 10,211,092 B1 * | 2/2019 | Cheng | H01L 21/7682 |

(Continued)

*Primary Examiner* — William A Harriston
(74) *Attorney, Agent, or Firm* — Cantor Colburn LLP; Vazken Alexanian

(57) ABSTRACT

Structures and methods are presented for forming a vertical field effect transistors. The structure generally includes a top source/drain including an L-shaped spacer on sidewalls and a portion of the bottom surface of the top source/drain. At least one airgap top spacer is provided adjacent top sidewalls of the fin and between the top source/drain and the gate electrode.

20 Claims, 10 Drawing Sheets

(56) References Cited

U.S. PATENT DOCUMENTS

| | | | |
|---|---|---|---|
| 10,229,986 B1* | 3/2019 | Jagannathan | H01L 29/6656 |
| 10,283,600 B2* | 5/2019 | Lee | H01L 29/41775 |
| 2008/0197397 A1* | 8/2008 | Parthasarathy | H01L 27/0207 |
| | | | 257/302 |
| 2011/0084340 A1* | 4/2011 | Yuan | H01L 21/76224 |
| | | | 257/368 |
| 2012/0104512 A1* | 5/2012 | Horak | H01L 29/4983 |
| | | | 257/401 |
| 2012/0302014 A1* | 11/2012 | Huang | H01L 29/0673 |
| | | | 438/164 |
| 2015/0243544 A1* | 8/2015 | Alptekin | H01L 21/7682 |
| | | | 438/586 |
| 2018/0269312 A1* | 9/2018 | Xie | H01L 29/66666 |

* cited by examiner

US 10,453,934 B1

VERTICAL TRANSPORT FET DEVICES HAVING AIR GAP TOP SPACER

BACKGROUND

The present invention relates in general to semiconductor fabrication methods and resulting structures. More specifically, the present invention relates to methods of fabricating vertical transport field effect transistors (VFETs) including an airgap in the top spacer of the top source/drain extension regions.

VFETs are one of the promising alternatives to standard lateral FET structures due to benefits, among others, in terms of reduced circuit footprint. VFETs employ semiconductor fins and side-gates that can be contacted outside the active region, resulting in increased device density and some increased performance over lateral devices. In VFETs, the source to drain current flows in a direction that is perpendicular to a major surface of the substrate. For example, in a known VFET configuration a major substrate surface is horizontal and a vertical fin extends upward from the substrate surface. The fin forms the channel region of the transistor. A source region and a drain region are situated in electrical contact with the top and bottom ends of the channel region, while a gate is disposed on one or more of the fin sidewalls. One advantage of a vertical transistor is that the channel length is not defined by lithography, but by methods such as epitaxy or layer deposition, which enable precise dimensional control.

SUMMARY

Embodiments of the present invention are generally directed to integrated circuits including one or more vertical field effect transistors and methods of fabrication. A non-limiting example of a method for forming a vertical field effect transistor structure according to aspects of the invention includes forming a fin over a bottom source/drain region on a semiconductor substrate. A gate electrode including a high k dielectric layer, a work function metal, and a gate metal are provided over sidewalls of the fin. A top source/drain is on a top surface of the fin having a width dimension greater than a width dimension of the fin such that the high k dielectric and work function metal underlies the top source/drain. The top source drain further includes an L-shaped nitride spacer extending about the sidewalls and a portion of a bottom surface of the top source/drain. A conformal nitride or low k dielectric layer seals the top source/drain including the L-shaped spacers, sidewalls at an upper portion of the fin, and the gate electrode. A dielectric layer overlays the top source/drain and the gate electrode, wherein the dielectric layer provides a vertical air-gap top spacer adjacent sidewalls of an upper portion of the fin and between the top source/drain and the gate electrode.

A non-limiting example of a method of forming one or more vertical field effect transistors in an integrated circuit according to aspects of the invention includes providing an L-shaped nitride spacer on a sidewall and a bottom surface of a top source/drain. The top source/drain is on a fin and has a width dimension greater than a width dimension of the fin, wherein the fin includes a high k dielectric layer on sidewalls of the fin, a work function metal on the high k dielectric layer and a gate metal. The high k dielectric layer and the work function metal underlie the top source drain and the gate metal has an upper surface coplanar to an upper surface of the top source/drain. The gate metal is recessed to expose a portion of the work function metal. The exposed portion of the work function metal is laterally etched so as to expose a portion of the high k dielectric. The exposed portion of the high k dielectric is laterally etched to expose a sidewall surface of the fin. A nitride or a low k dielectric layer is conformally deposited onto the gate structure, the exposed sidewall surface of the fin, and about the top source/drain. A non-conformal layer of an oxide layer is deposited to form a vertical airgap top spacer adjacent the fin and between the top source/drain and the gate electrode.

A non-limiting example of a method for forming a semiconductor structure according to aspects of the invention includes forming a fin over a semiconductor substrate, wherein the fin includes a hardmask thereon having a width dimension greater than a width dimension of the fin. A gate structure is formed about the sidewalls of the fin, the gate structure extending above the bottom source/drain region. The gate structure includes a stack including a high k dielectric and a work function metal on the high k dielectric underlying the hardmask, and a metal gate on the work function metal. The metal gate is recessed to a height below a topmost surface of the hardmask. A conformal protection layer is formed on the gate structure and hardmask. A non-conformal first oxide layer is formed on the conformal protection layer. The first oxide layer is planarized to open the hardmask. The hardmask is selectively pulled to form an opening exposing a top surface of the fin. A nitride layer is conformally deposited followed by conformally depositing a second oxide layer. The first oxide layer and the nitride layer are directionally etched to the second oxide layer so as to provide an L-shaped inner spacer and an oxide inner spacer in the opening. The second oxide layer and the oxide inner spacer are removed. An epitaxially grown top source/drain is formed in the opening and on the fin, wherein the L-shaped spacer is on a sidewall of the top source/drain and a portion of a bottom surface of the top source/drain. The protection layer is removed and the metal gate of the gate structure recessed to expose a portion of the work function metal. The exposed work function metal and an adjacent portion of the high k dielectric underlying the top source drain are laterally etched to expose a portion of the fin underlying the epitaxially grown top source/drain. A conformal layer of a low k dielectric material or a nitride is deposited followed by a non-conformal layer of an oxide to form a vertical airgap adjacent the fin. is laterally etched

DETAILED DESCRIPTION

Figure 1:
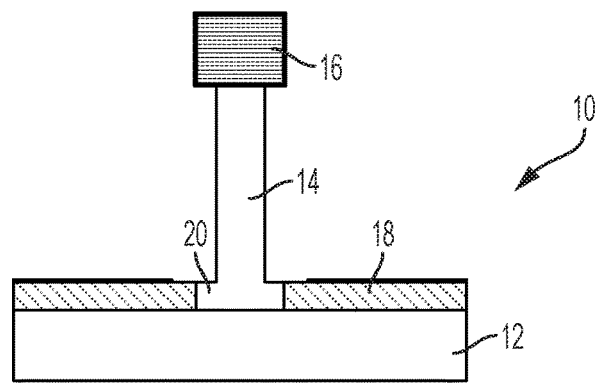
FIG. 1 depicts a cross sectional view of a semiconductor structure including a fin formed on a substrate including a hardmask thereon having a width dimension greater than the fin and a bottom spacer layer on the substrate in accordance with one or more embodiments.

Vertical field effect transistors (VFETs) are an attractive option for technology scaling for 5 nm and beyond. However, the increasing density in those technology nodes has the effect of increasing the parasitic capacitance between the gate and the source/drain epitaxy. The present invention is generally directed to VFET structures and methods for forming an airgap between the top spacer and the top source/drain extension regions for the VFET structure, i.e., located above each functional gate, which reduces the parasitic capacitance between the channel and the top source/drain.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, an article or apparatus that comprises a list of elements is not necessarily limited to only those elements but can include other elements not expressly listed or inherent to such article or apparatus.

As used herein, the articles "a" and "an" preceding an element or component are intended to be nonrestrictive regarding the number of instances (i.e. occurrences) of the element or component. Therefore, "a" or "an" should be read to include one or at least one, and the singular word form of the element or component also includes the plural unless the number is obviously meant to be singular.

As used herein, the terms "invention" or "present invention" are non-limiting terms and not intended to refer to any single aspect of the particular invention but encompass all possible aspects as described in the specification and the claims.

The terms "about," "substantially," "approximately," "slightly less than," and variations thereof, are intended to include the degree of error associated with measurement of the particular quantity based upon the equipment available at the time of filing the application. For example, "about" can include a range of ±8% or 5%, or 2% of a given value.

Detailed embodiments of the structures of the present invention are described herein. However, it is to be understood that the embodiments described herein are merely illustrative of the structures that can be embodied in various forms. In addition, each of the examples given in connection with the various embodiments of the invention is intended to be illustrative, and not restrictive. Further, the figures are not necessarily to scale, some features can be exaggerated to show details of particular components. Therefore, specific structural and functional details described herein are not to be interpreted as limiting, but merely as a representative basis for teaching one skilled in the art to variously employ the methods and structures of the present description. For the purposes of the description hereinafter, the terms "upper", "lower", "top", "bottom", "left," and "right," and derivatives thereof shall relate to the described structures, as they are oriented in the drawing figures. The same numbers in the various figures can refer to the same structural component or part thereof.

It should also be understood that material compounds will be described in terms of listed elements, e.g., SiN, or SiGe. These compounds include different proportions of the elements within the compound, e.g., SiGe includes $Si_xGe_{1-x}$ where x is less than or equal to 1, and the like. In addition, other elements can be included in the compound and still function in accordance with the present principles. The compounds with additional elements will be referred to herein as alloys.

It should be noted that not all masking, patterning, and lithography processes are shown, because a person of ordinary skill in the art would recognize where masking and patterning processes are utilized to form the identified layers and openings, and to perform the identified selective etching processes, as described herein.

Turning now to FIG. 1, there is shown a cross section of an exemplary incoming semiconductor structure 10 suitable for completing fabrication of semiconductor structure including one or more VTFETs in accordance with one or more embodiments. The semiconductor structure 10 includes a semiconductor fin 14 (i.e., channel) on a base substrate 12, one of which are shown. Although a single fin is shown, it should be apparent that multiple fins can be present as can be desired for different applications.

The base substrate 12 can include, for example, silicon, germanium, silicon germanium, silicon carbide, and those consisting essentially of III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The base substrate 12 can also include an organic semiconductor or a layered semiconductor such as, for example, Si/SiGe, a silicon-on-insulator or a SiGe-on-insulator. A portion or entire semiconductor substrate 12 can be amorphous, polycrystalline, or monocrystalline. In addition to the aforementioned types of semiconductor substrates, the base substrate employed in the present invention can also include a hybrid oriented (HOT) base substrate in which the HOT substrate has surface regions of different crystallographic orientation. The base substrate 12 can be doped, undoped or contain doped regions and undoped regions therein. The base substrate can contain regions with strain and regions without strain therein, or contain regions of tensile strain and compressive strain.

Each semiconductor fin 14 can be formed by lithography and etching. The lithographic step can include forming a photoresist (not shown) atop a substrate including a topmost semiconductor material, exposing the photoresist to a desired pattern of radiation and then developing the exposed photoresist utilizing a conventional resist developer. The pattern within the photoresist is then transferred into the topmost semiconductor material. The etch step can include a dry etch process, a chemical wet etch process, or any combination thereof. When a dry etch is used, the dry etch can be a reactive ion etch process, a plasma etch process, ion beam etching or laser ablation. The patterned photoresist material can be removed after transferring the pattern utilizing a conventional stripping process.

In one or more embodiments, each semiconductor fin 14 can be formed utilizing a SIT (sidewall image transfer) process. In a typical SIT process, spacers are formed on sidewall surfaces of a sacrificial mandrel that is formed on a topmost semiconductor material of a substrate. The sacrificial mandrel is removed and the remaining spacers are used as a hard mask to etch the topmost semiconductor material of the substrate. The spacers are then removed after each semiconductor fin 14 has been formed. In another embodiment, sequential SIT processes can be utilized to form fins with highly scaled fin width and pitches.

The number and size of fin channels 14 to be formed can be based on the intended current handling capacity of the electronic device structure. Formation of the fin channels generally includes deposition and lithographic patterning of a hardmask layer 16 followed by an anisotropic etching process. Because there is no stop layer on the base substrate 12, the etch process can be time-based. A suitable anisotropic etching process includes reactive ion etching. The height of the fin channels 14 in the z direction can be in the range of about 30 nm to about 400 nm, or in the range of about 50 nm to about 300 nm, or in the range of about 75 nm to about 200 nm. In various embodiments, the width of the fin channels 20 in the x direction can be in the range of about 5 nm to about 30 nm, or about 10 nm to about 20 nm. In various embodiments, the aspect ratio of the fin channels 20 can be in the range of about 3 to about 40, or in the range of about 5 to about 20, or in the range of about 7 to about 10. In various embodiments, the fin channels 20 can have a length in the y direction in the range of about 10 nm to about 2000 nm, or in the range of about 20 nm to about 1000 nm, or in the range of about 25 nm to about 500 nm, where the length in the y direction is greater than the width in the x direction.

The hardmask 16 can include, for example, silicon oxide, silicon nitride (SiN), or any suitable combination of those. The hardmask 18 can be deposited using a deposition process, including, but not limited to, PVD, CVD, PECVD, or any combination thereof.

A bottom spacer layer 18 can be deposited by any non-conformal deposition methods that provides a faster deposition rate on the planar surface and slower deposition rate on the sidewall surface including but not limited to plasma vapor deposition (PVD), high density plasma (HDP) deposition or the like. As shown, the bottom spacer layer is disposed between the vertically oriented fin structures. The PVD or HDP process is highly directional and deposits the spacer onto the bottom of the trenches but less on fin sidewall. After directional deposition of bottom spacer, an etch-back process can be performed to remove the any residue of spacer materials from a sidewall of the fin 14. In PVD, a pure source material is gasified via evaporation, the application of high power electricity, laser ablation, or the like. The gasified material will then condense on the substrate material to create the desired layer. The bottom spacer 18 can be a low k dielectric material. The term "low k dielectric" generally refers to an insulating material having a dielectric constant less than silicon dioxide, i.e., less than 3.9. Exemplary low k dielectric materials include, but are not limited to, dielectric nitrides (e.g., silicon nitride, SiBCN), dielectric oxynitrides (e.g., SiOCN), SiCN, or any combination thereof or the like.

In one or more embodiments, the bottom spacer layer 18 can have a thickness in the range of about 3 nm to about 10 nm, or in the range of about 3 nm to about 5 nm.

It should be apparent that the bottom spacer layer 18 can be formed adjacent bottom source/drain regions 20 (e.g., drain regions as well as the source regions for the completed VFETs), which can be formed by an epitaxial growth process that deposits a crystalline semiconductor material onto selected areas of the substrate 12 to form the bottom source/drain region 20. By way of example, the bottom source/drain regions for pFETs can be formed of SiGe:B, and bottom source/drain regions for nFETs can be formed of Si:P. The epitaxial growth process can include epitaxial materials grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) silicon can be doped during deposition (in-situ doped) by adding dopants, n-type dopants (e.g., phosphorus or arsenic) or p-type dopants (e.g., boron or gallium), depending on the type of transistor. The dopant concentration in the source/drain generally can range from about $1\times10^{19}$ cm$^{-3}$ to about $2\times10^{21}$ cm$^{-3}$, or, in other embodiments, from about $2\times10^{20}$ cm$^{-3}$ to about $1\times10^{21}$ cm$^{-3}$.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a {100} orientated crystalline surface will take on a {100} orientation. In some embodiments, epitaxial growth and/or deposition processes are selective to forming on semiconductor surface, and generally do not deposit material on exposed surfaces, such as silicon dioxide or silicon nitride surfaces.

In some embodiments, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

The fin 14 is laterally etched to thin the fin channel 14 to a desired width. Lateral thinning of the fin channel can be effected by an isotropic etch process. As such, the hardmask 16 had a width dimension greater than a width dimension of the fin.

Figure 2:
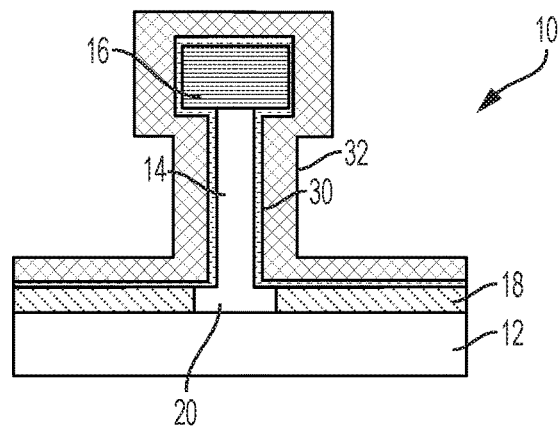
FIG. 2 depicts a cross sectional view of the semiconductor structure of FIG. 1 subsequent to high k dielectric and work function metal formation in accordance with one or more embodiments.

FIG. 2 depicts the semiconductor structure 10 subsequent to high k dielectric/work function metal gate formation. A high k dielectric material 30 is conformally deposited onto the structure followed by conformal deposition of a workforce metal gate material 32.

The high k gate dielectric material(s) can be a dielectric material having a dielectric constant greater than 3.9, 7.0, or 10.0. Non-limiting examples of suitable materials for the dielectric materials include oxides, nitrides, oxynitrides, silicates (e.g., metal silicates), aluminates, titanates, nitrides, or any combination thereof. Examples of high-k materials (with a dielectric constant greater than 7.0) include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k material can further include dopants such as, for example, lanthanum and aluminum.

The gate dielectric materials can be formed by suitable deposition processes, for example, chemical vapor deposition (CVD), plasma-enhanced chemical vapor deposition (PECVD), atomic layer deposition (ALD), evaporation, physical vapor deposition (PVD), chemical solution deposition, or other like processes. The thickness of the dielectric material can vary depending on the deposition process as well as the composition and number of high-k dielectric materials used. The dielectric material layer can have a thickness in a range from about 0.5 to about 20 nm.

The work function metal(s) 32 can be disposed over the high k gate dielectric material 30. The type of work function metal(s) depends on the type of transistor and can differ between the nFET and pFET devices. Non-limiting examples of suitable work function metals include p-type work function metal materials and n-type work function metal materials. P-type work function materials include compositions such as titanium nitride, tantalum nitride, ruthenium, palladium, platinum, cobalt, nickel, and conductive metal oxides, or any combination thereof. N-type metal materials include compositions such as hafnium, zirconium, titanium, tantalum, aluminum, metal carbides (e.g., hafnium carbide, zirconium carbide, titanium carbide, and aluminum carbide), aluminides, or any combination thereof. The work function metal(s) can be deposited by a suitable deposition process, for example, CVD, PECVD, PVD, plating, thermal or e-beam evaporation, and sputtering.

Figure 3:
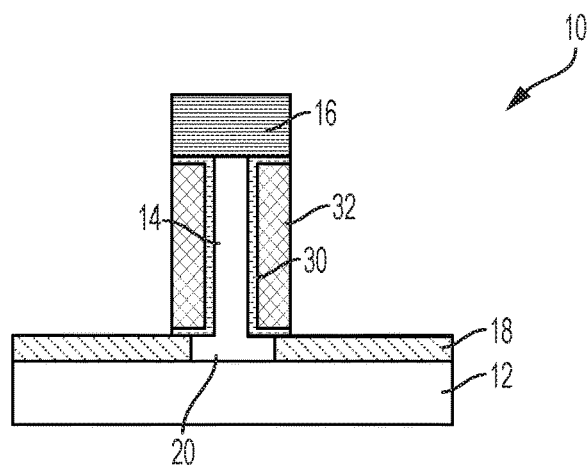
FIG. 3 depicts a cross sectional view of the semiconductor structure of FIG. 2 subsequent to directional etching to remove a portion of the high k dielectric and the work function metal from the bottom spacer layer in accordance with one or more embodiments.

In the cross sectional view of FIG. 3, the high k dielectric 30 and the work function metal 32 are subjected to an anisotropic etch process, e.g., a reactive ion etch (RIE) process, to the bottom spacer layer 18. RIE is a form of plasma etching in which during etching the surface to be etched is placed on the RF powered electrode. Moreover, during RIE the surface to be etched takes on a potential that accelerates the etching species extracted from plasma toward the surface, in which the chemical etching reaction is taking place in the direction normal to the surface. Other examples of anisotropic etching that can be used include ion beam etching, plasma etching or laser ablation. Due to the presence of the hardmask 16 having a width greater than a width of the previously thinned fin channel 14, the high k dielectric 30 and work function metal 32 remain under the hardmask 16 as shown such that a combined width of the workforce metal 32, the high k dielectric 30, and the fin 14 is about equal to a thickness of the hardmask 16.

Figure 4:
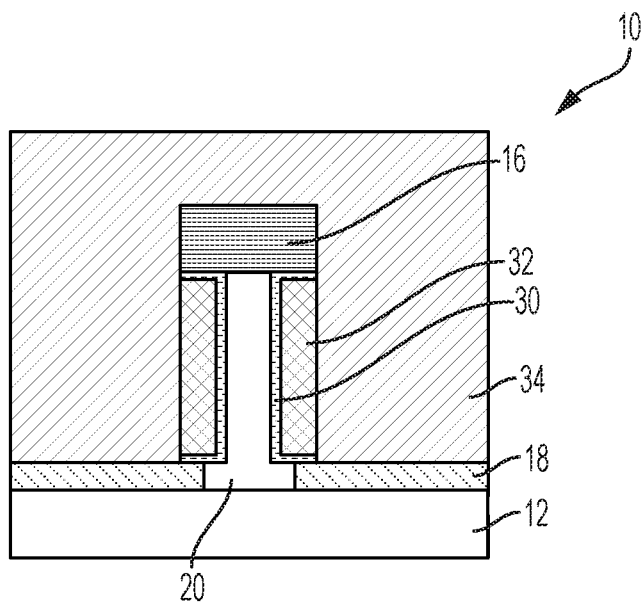
FIG. 4 depicts a cross sectional view of the semiconductor structure of FIG. 3 subsequent to gate metal formation in accordance with one or more embodiments.

FIG. 4 illustrates a cross sectional view of the structure of FIG. 3 subsequent deposition of the metal gate 34. Suitable gate metals include, but are not limited to titanium nitride (TiN), tantalum nitride (TaN), tungsten (W), gold (Au), titanium (Ti), aluminum (Al), platinum (Pt) and combinations including at least one of the foregoing metals.

Figure 5:
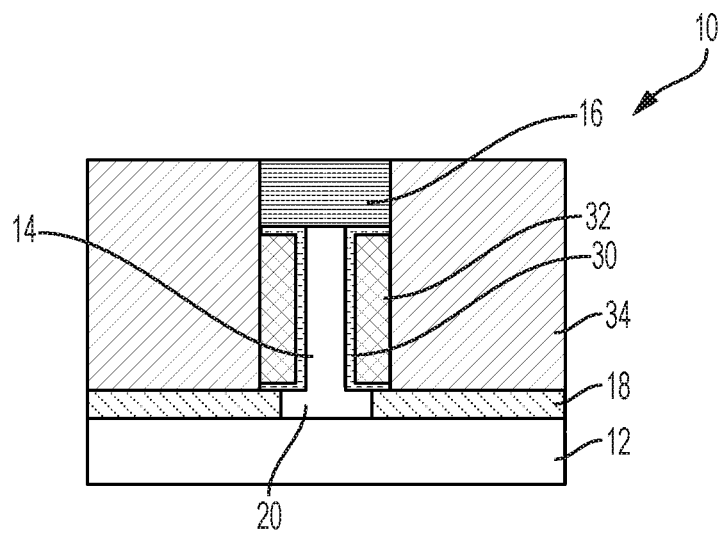
FIG. 5 depicts a cross sectional view of the semiconductor structure of FIG. 4 subsequent to planarization of the metal gate to the hardmask in accordance with one or more embodiments.

FIG. 5 illustrates a cross sectional view of the structure of FIG. 4 subsequent to a process to remove any gate metal overburden and form a planar top surface of the deposited gate metal. The CMP process stops on the hardmask 16. In one or more embodiments, the planarization process can be chemical-mechanical polishing (CMP) and/or etching. Other planarization process can include grinding and polishing. Planarization generally refers to a material removal process that employs at least mechanical forces, such as frictional media, to produce a substantially two-dimensional surface. CMP is an exemplary material removal process that uses both chemical reactions and mechanical forces to remove material and planarize a surface.

Figure 6:
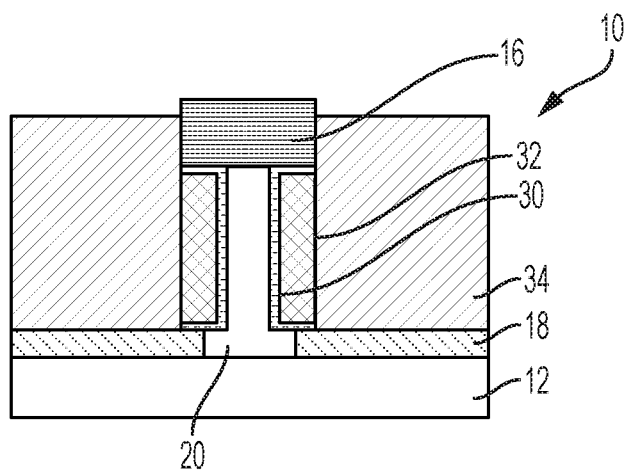
FIG. 6 depicts a cross sectional view of the semiconductor structure of FIG. 5 subsequent to a recess of the gate metal in accordance with one or more embodiments.

In the cross sectional view of FIG. 6, the gate metal selectively recessed relative to the hardmask. A wet or dry etch can be used to selectively remove the gate metal 34 to form the recess.

Figure 7:
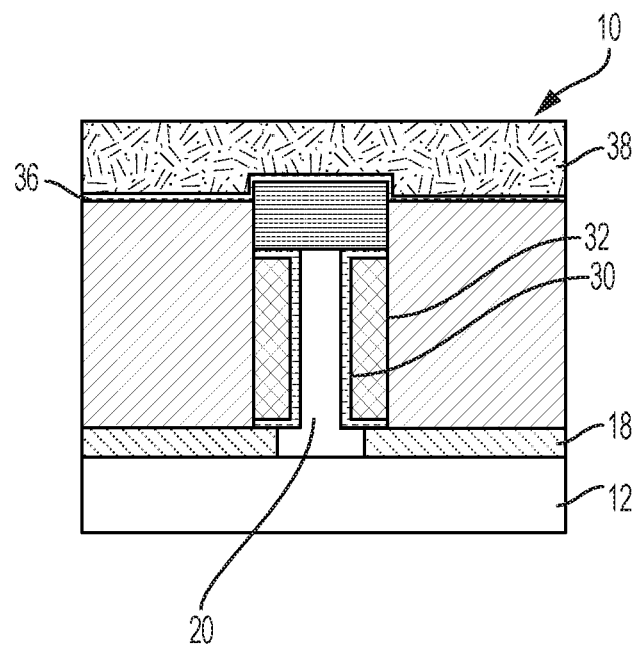
FIG. 7 depicts a cross sectional view of the semiconductor structure of FIG. 6 subsequent to deposition of a protective layer in accordance with one or more embodiments.

FIG. 7 illustrates a cross sectional view of the structure of FIG. 6 subsequent to deposition of a protective layer 36 onto the exposed surface of the hardmask 16 and gate metal layer 34. The protective layer 36 can be a nitride such as silicon nitride or a high k dielectric material. A non-conformal oxide layer 38 is then deposited onto the protective layer 36.

Figure 8:
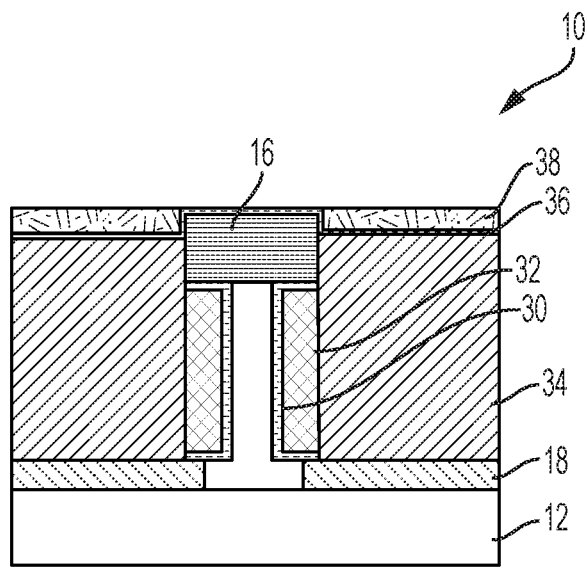
FIG. 8 depicts a cross sectional view of the semiconductor structure of FIG. 7 subsequent to planarization to open the hardmask in accordance with one or more embodiments.

FIG. 8 illustrates a cross sectional view of the structure of FIG. 7 subsequent to a planarization process to open the hardmask 16, i.e., expose a top surface of the hardmask layer such that the hardmask top surface is coplanar to a top surface of the oxide layer.

Figure 9:
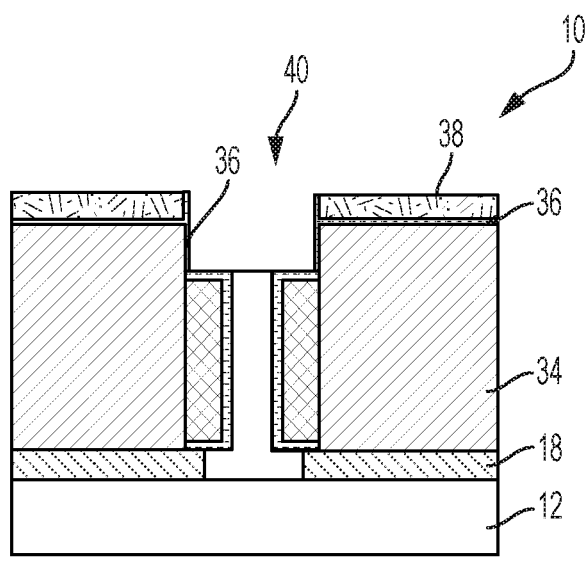
FIG. 9 depicts a cross sectional view of the semiconductor structure of FIG. 8 subsequent to a hardmask pull process to form an opening in accordance with one or more embodiments.

FIG. 9 illustrates a cross sectional view of the structure of FIG. 8 subsequent to selectively pulling hardmask 16 to form opening 40 and expose a top surface of the fin channel 14. The hardmask 16 can be selectively removed by a dry or wet etch process. For example, in the case of a silicon nitride hardmask, the silicon nitride can be selectively removed relative to the metal gate 34, liner layer 36 and the channel 14 by exposing the substrate to hot phosphoric acid.

Figure 10:
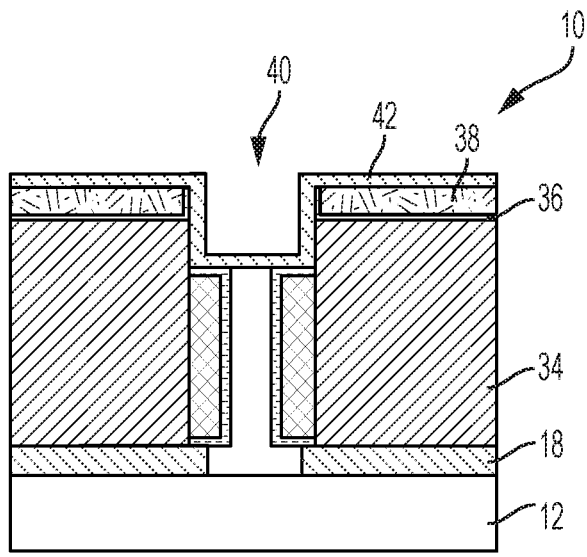
FIG. 10 depicts a cross sectional view of the semiconductor structure of FIG. 9 subsequent to conformal deposition of a nitride layer in accordance with one or more embodiments.

FIG. 10 illustrates a cross sectional view of the structure of FIG. 9 subsequent to deposition of a conformal layer of a nitride layer 42 is deposited onto the substrate 12.

Figure 11:
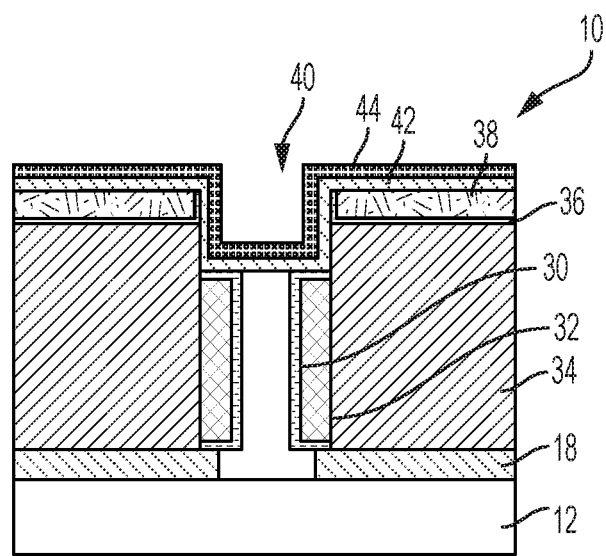
FIG. 11 depicts a cross sectional view of the semiconductor structure of FIG. 10 subsequent to conformal deposition of an oxide layer in accordance with one or more embodiments.

FIG. 11 depicts a cross sectional view of the structure of FIG. 10 subsequent to conformal deposition of an oxide layer 44 onto the substrate 12.

Figure 12:
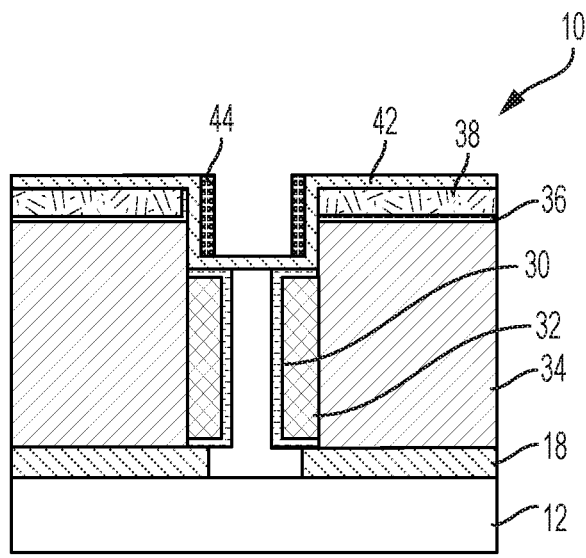
FIG. 12 depicts a cross sectional view of the semiconductor structure of FIG. 11 subsequent to a directional oxide etch back process to form oxide inner spacers in accordance with one or more embodiments.

FIG. 12 depicts a cross sectional view of the structure of FIG. 11 subsequent to a selective oxide etch back process to the nitride layer 42 such that oxide remains on nitride layer 42 on the sidewalls of opening 40. An exemplary etch back process includes exposing the substrate to a reactive ion etch process selective to the oxide.

Figure 13:
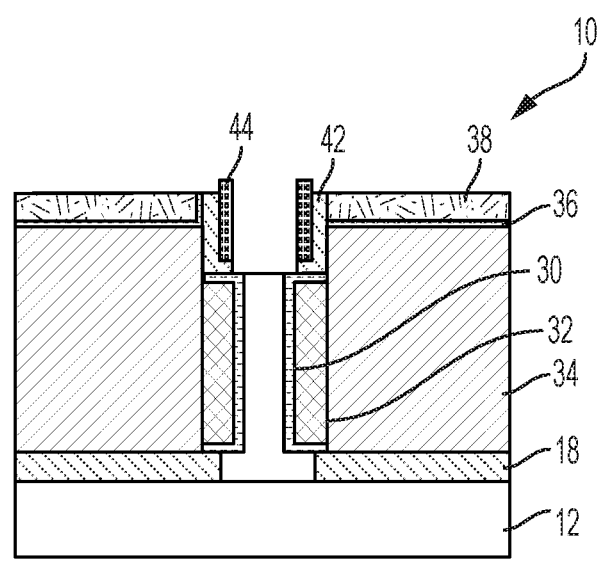
FIG. 13 depicts a cross sectional view of the semiconductor structure of FIG. 12 subsequent to a directional nitride etch back process to form L-shaped nitride inner spacers and expose a top surface of the fin in accordance with one or more embodiments.

FIG. 13 depicts a cross sectional view of the structure of FIG. 12 subsequent to an etch back process to the oxide layer 42 such that nitride layer 44 remains on the sidewalls of opening 40. In this manner, an L-shaped silicon nitride layer remains in the opening 36, which will be used to form an inner spacer for the top source/drain region. The horizontal portion of the silicon nitride layer 42 cover the high k dielectric layer 32 and whereas the vertical portion covers a surface of the gate metal 34.

Figure 14:
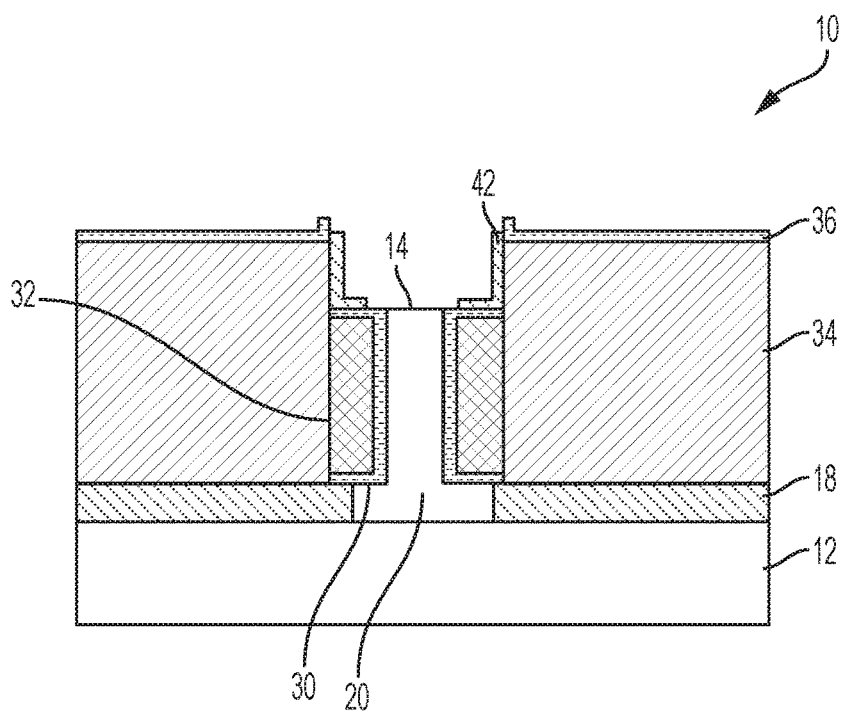
FIG. 14 depicts a cross sectional view of the semiconductor structure of FIG. 13 subsequent to an isotropic oxide strip process to remove exposed oxide from the substrate in accordance with one or more embodiments.

FIG. 14 depicts a cross sectional view of the structure of FIG. 13 subsequent to selective removal of the oxide layer 44 from nitride layer 42 on the sidewalls of opening 40 and the oxide layer 38.

Figure 15:
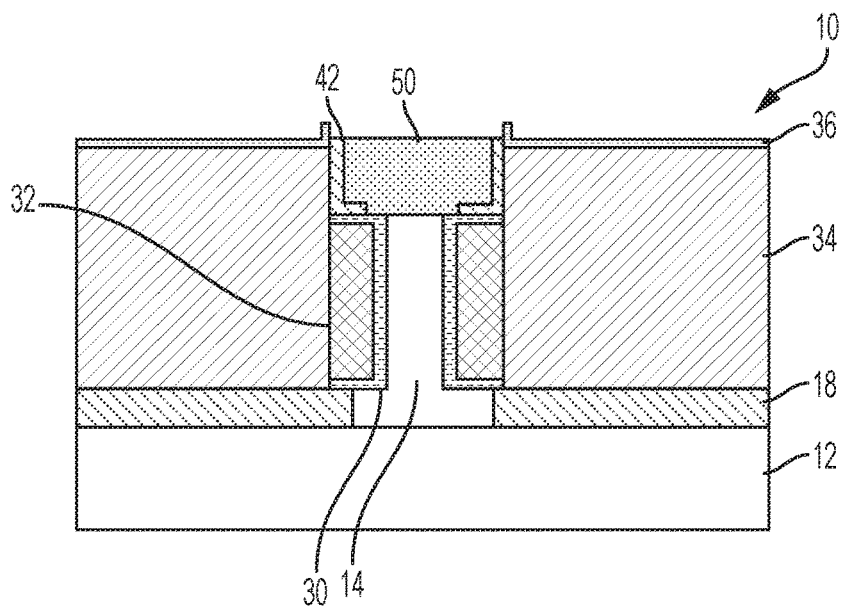
FIG. 15 depicts a cross sectional view of the semiconductor structure of FIG. 14 subsequent to epitaxial formation of top source/drain in the opening in accordance with one or more embodiments.

FIG. 15 depicts a cross sectional view of the structure of FIG. 14 subsequent to epitaxial deposition of a top source/drain region 50 on the fin 14.

Figure 16:
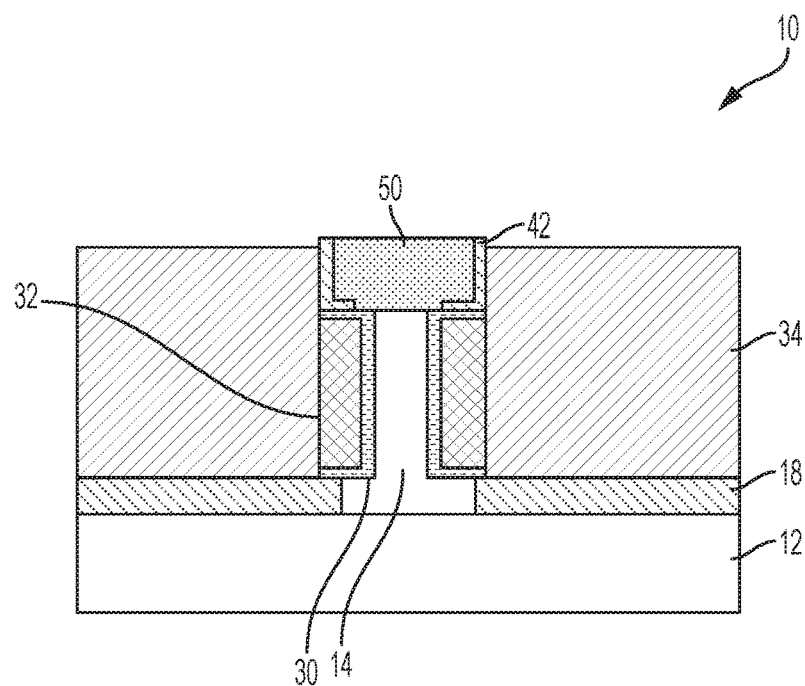
FIG. 16 depicts a cross sectional view of the semiconductor structure of FIG. 15 subsequent to a removal process to remove the protective layer in accordance with one or more embodiments.

FIG. 16 depicts a cross sectional view of the structure of FIG. 15 subsequent to a planarization process to the gate metal 34 so as to remove the exposed surfaces of the liner layer 36.

Figure 17:
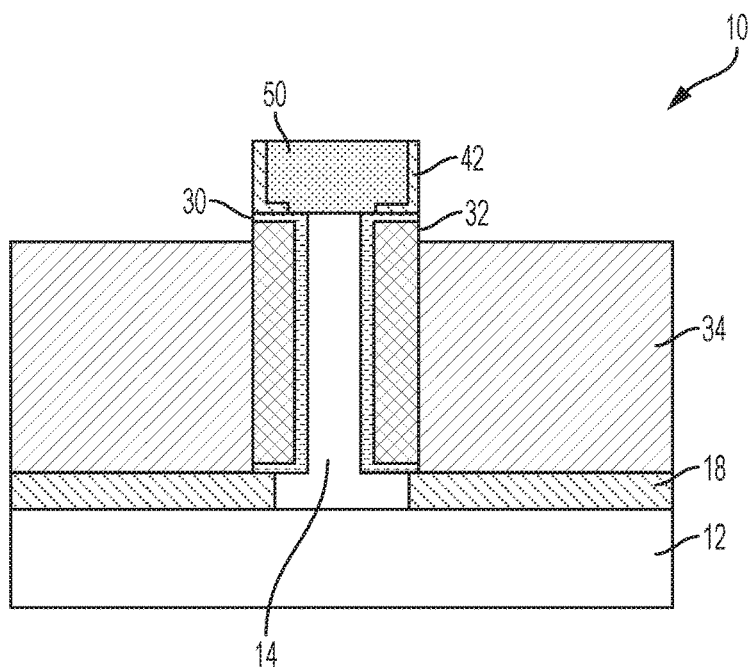
FIG. 17 depicts a cross sectional view of the semiconductor structure of FIG. 16 subsequent to a recess of the gate metal in accordance with one or more embodiments.

FIG. 17 depicts a cross sectional view of the structure of FIG. 16 subsequent to recessing the metal gate 34. Recessing can be effected by wet etch process selective to the metal. The etch process can be timed. Recessing the metal gate 34 exposes a portion of the work function metal 32. The depth of the recess relative to the top source/drain will generally dictate the dimensions of an air gap top spacer that will be subsequently formed.

Figure 18:
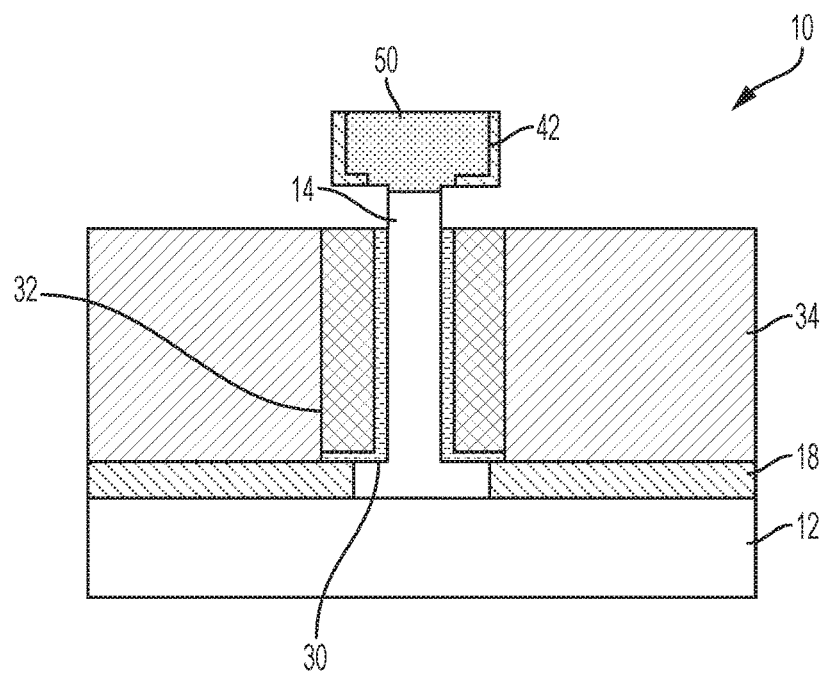
FIG. 18 depicts a cross sectional view of the semiconductor structure of FIG. 17 subsequent to lateral etch of the exposed work function metal and the high k dielectric layer in accordance with one or more embodiments.

FIG. 18 depicts a cross sectional view of the structure of FIG. 17 subsequent to lateral etch to remove the exposed work function metal 32 and the high k dielectric 30 about the fin 14.

Figure 19:
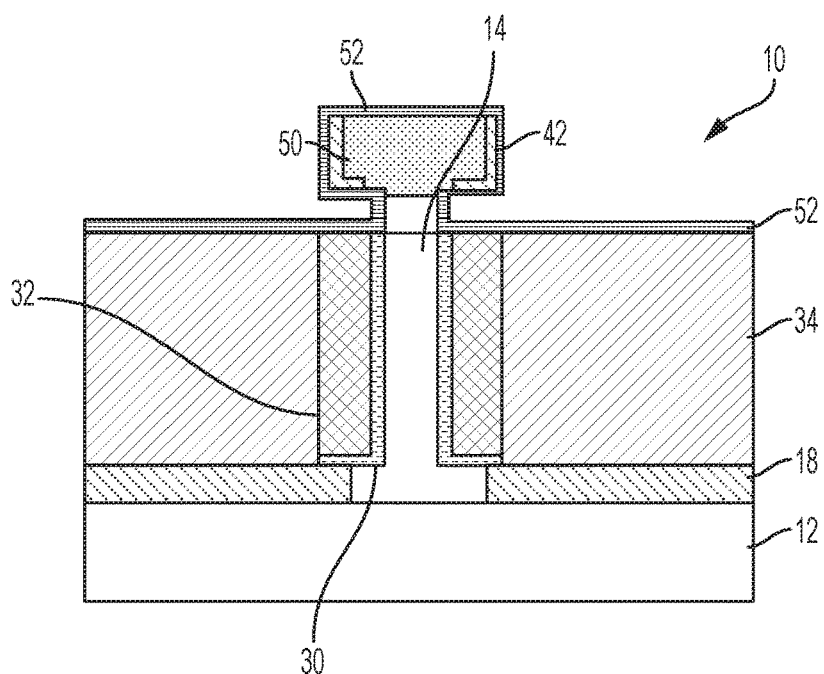
FIG. 19 depicts a cross sectional view of the semiconductor structure of FIG. 18 subsequent to conformal deposition of a nitride or low k dielectric to seal the gate structure and top source/drain in accordance with one or more embodiments.

FIG. 19 depicts a cross sectional view of the structure of FIG. 18 subsequent conformal deposition of a low k dielectric or nitride layer 52 onto the structure to seal the gate structure (30, 32, 34) and encapsulate the top source drain 50 including the L-shaped nitride 42.

Figure 20:
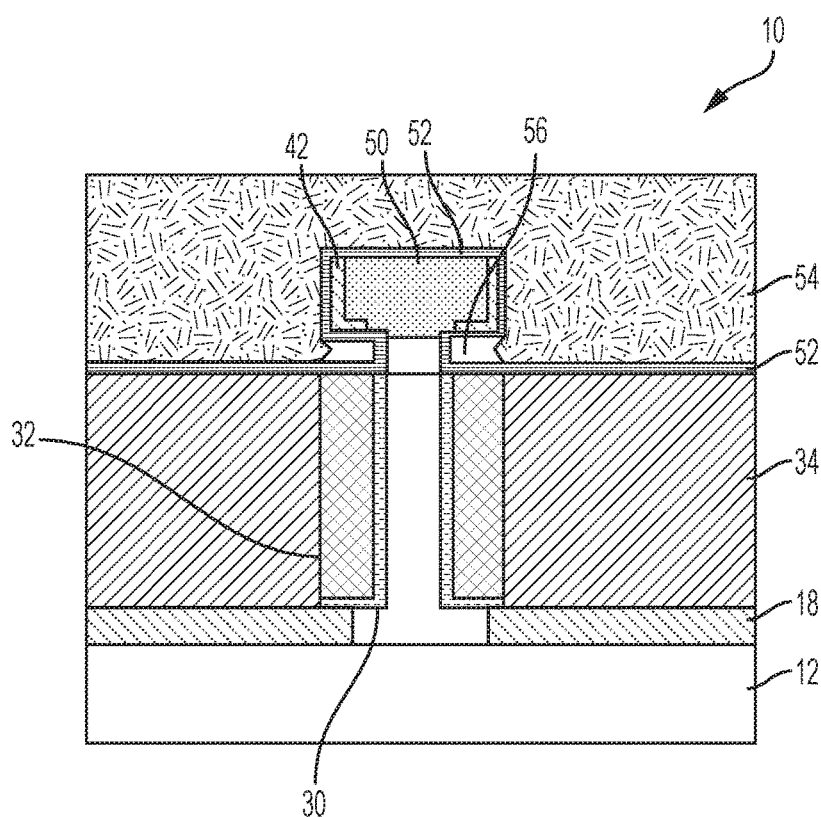
FIG. 20 depicts a cross sectional view of the semiconductor structure of FIG. 19 subsequent to non-formal deposition of an oxide to form an air gap top spacer adjacent the fin in accordance with one or more embodiments.

FIG. 20 depicts a cross sectional view of the structure of FIG. 22 subsequent to non-conformal deposition an oxide layer 54. The non-conformal deposition of the oxide layer 54 results in an airgap 56 between the source/drain 42 and the dielectric layer 52. Advantageously, parasitic capacitance between the gate structure 30, 32, 34 and the top source/drain epi region 50 for the VFET is reduced by forming the airgaps 56. The airgap 56 generally has dimensions of greater than 0 to less than about 12 nanometers in the x-direction and greater than 0 to less than about 10 nanometers in the y-direction.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A vertical field effect transistor structure comprising:
    a fin disposed over a bottom source/drain region on a semiconductor substrate;
    a gate electrode comprising a high k dielectric layer, a work function metal, and a gate metal provided over sidewalls of the fin;
    a top source/drain on a top surface of the fin having a width dimension greater than a width dimension of the fin such that the high k dielectric and work function metal underlies the top source/drain, wherein the top source drain further comprises an L-shaped nitride spacer extending about the sidewalls and a portion of a bottom surface of the top source/drain;
    a conformal nitride or low k dielectric layer sealing the top source/drain including the L-shaped spacers, sidewalls at an upper portion of the fin, and the gate electrode; and
    a dielectric layer overlaying the top source/drain and the gate electrode, wherein the dielectric layer provides a vertical air-gap top spacer adjacent sidewalls of an upper portion of the fin and between the top source/drain and the gate electrode.

2. The vertical field effect transistor of claim 1, wherein the vertical air gap top spacer has dimensions of greater than 0 to less than about 12 nanometers in the x-direction and greater than 0 to less than about 10 nanometers in the y-direction.

3. The vertical field effect transistor of claim 1, wherein the top source/drain is rectangular-shaped.

4. The vertical field effect transistor of claim 1, wherein the work function metal is a p-type metal.

5. The vertical field effect transistor of claim 4, wherein the p-type metal comprises titanium nitride, tantalum nitride, ruthenium, palladium, platinum, cobalt, nickel, and conductive metal oxides, or any combination thereof.

6. The vertical field effect transistor of claim 1, wherein the work function metal is an n-type metal.

7. The vertical field effect transistor of claim 6, wherein the n-type metal comprises hafnium, zirconium, titanium, tantalum, aluminum, metal carbides, aluminides, or any combination thereof.

8. A method of forming a vertical field effect transistor, the method comprising:
providing an L-shaped nitride spacer on a sidewall and a bottom surface of a top source/drain, wherein the top source/drain is on a fin and has a width dimension greater than a width dimension of the fin, wherein fin comprises a high k dielectric layer on sidewalls of the fin, a work function metal on the high k dielectric layer and a gate metal, wherein the high k dielectric layer and the work function metal underlie the top source drain and the gate metal has an upper surface coplanar to an upper surface of the top source/drain;
recessing the gate metal to expose a portion of the work function metal;
laterally etching the exposed portion of the work function metal so as to expose a portion of the high k dielectric;
laterally etching the exposed portion of the high k dielectric to expose a sidewall surface of the fin;
depositing a conformal nitride or a low k dielectric layer onto the gate structure, the exposed sidewall surface of the fin, and about the top source/drain;
depositing a non-conformal layer of an oxide layer to form a vertical airgap top spacer adjacent the fin and between the top source/drain and the gate electrode.

9. The method of claim 8, wherein the vertical air gap top spacer has dimensions of greater than 0 to less than about 12 nanometers in the x-direction and greater than 0 to less than about 10 nanometers in the y-direction.

10. The method of claim 9, wherein the top source/drain is rectangular-shaped.

11. The method of claim 9, wherein the vertical field effect transistor is an n-type field effect transistor.

12. The method of claim 9, wherein the vertical field effect transistor is a p-type field effect transistor.

13. The method of claim 9, wherein the gate metal comprises titanium nitride, tantalum nitride, tungsten, gold, titanium, aluminum, platinum, or combinations thereof.

14. The method of claim 8, wherein providing the L-shaped nitride spacer on the sidewall and the bottom surface of a top source/drain comprises:
forming a fin over a semiconductor substrate, wherein the fin includes a hardmask thereon having a width dimension greater than a width dimension of the fin; forming the gate structure along the sidewalls of the fin, the gate structure extending above the bottom source/drain and the bottom spacer;
recessing the metal gate to below an upper surface of the hardmask;
depositing a conformal protection layer;
depositing an oxide layer onto the projection layer and planarizing the oxide layer to open the hardmask;
pulling the hardmask to form an opening exposing the top surface of the fin;
depositing a conformal nitride layer and an oxide layer on the nitride layer;
directionally etching the oxide layer to form an oxide inner spacer in the opening; and
epitaxially forming the top source/drain in the opening.

15. The method of claim 14, wherein the protection layer comprises a silicon nitride or low k dielectric layer.

16. A method of forming a semiconductor structure, the method comprising:
forming a fin over a semiconductor substrate, wherein the fin includes a hardmask thereon having a width dimension greater than a width dimension of the fin;
forming a gate structure along the sidewalls of the fin, the gate structure extending above the bottom source/drain region, wherein the gate structure comprises a stack comprising a high k dielectric and a work function metal on the high k dielectric underlying the hardmask and a metal gate on the work function metal;
recessing the metal gate to a height below a topmost surface of the hardmask;
forming a conformal protection layer on the gate structure and hardmask;
forming a non-conformal first oxide layer on the conformal protection layer;
planarizing the first oxide layer to open the hardmask;
selectively pulling the hardmask to form an opening exposing a top surface of the fin;
conformally depositing nitride layer followed by conformally depositing a second oxide layer;
directionally etching the first oxide layer and the nitride layer to the second oxide layer so as to provide an L-shaped inner spacer and an oxide inner spacer in the opening;
removing the second oxide layer and the oxide inner spacer;
forming an epitaxially grown top source/drain in the opening and on the fin, wherein the L-shaped spacer is on a sidewall of the top source/drain and a portion of a bottom surface of the top source/drain;
removing the protection layer and recessing the metal gate of the gate structure to expose a portion of the work function metal;
laterally etching the exposed work function metal and an adjacent portion of the high k dielectric underlying the top source drain to expose a portion of the fin underlying the epitaxially grown top source/drain;
depositing a conformal layer of a low k dielectric material or a nitride; and
depositing a non-conformal layer of an oxide and forming a vertical airgap adjacent the fin.

17. The method of claim 16, wherein forming the fin comprises laterally etching the fin so that the width dimension of the hardmask is greater than the width dimension of the fin.

18. The method of claim 16, wherein the protection layer comprises a nitride or a low k dielectric.

19. The method of claim 16, wherein the top source/drain is rectangular-shaped.

20. The method of claim 16, wherein the vertical air gap top spacer has dimensions of greater than 0 to less than about 12 nanometers in the x-direction and greater than 0 to less than about 10 nanometers in the y-direction.

* * * * *